(12) United States Patent  
Adams et al.

(10) Patent No.: US 8,331,180 B2
(45) Date of Patent: Dec. 11, 2012

(54) ACTIVE BIT LINE DROOP FOR READ ASSIST

(75) Inventors: Chad Allen Adams, Byron, MN (US); Sharon Huertas Cesky, Rochester, MN (US); Elizabeth Lair Gerhard, Rochester, MN (US); Jeffrey Milton Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 12/894,451

(22) Filed: Sep. 30, 2010

(65) Prior Publication Data

US 2012/0081949 A1    Apr. 5, 2012

(51) Int. Cl.
*G11C 7/00* (2006.01)

(52) U.S. Cl. .................. 365/203; 365/189.09; 365/204

(58) Field of Classification Search .................. 365/203, 365/204, 189.09
See application file for complete search history.

(56) References Cited

U.S. PATENT DOCUMENTS

| 6,990,002 B2* | 1/2006 | Mizuno et al. ............... 365/63 |
| 7,046,565 B1* | 5/2006 | Barth et al. ................. 365/203 |
| 7,385,865 B2* | 6/2008 | Khellah et al. .............. 365/203 |

\* cited by examiner

*Primary Examiner* — Son Dinh
(74) *Attorney, Agent, or Firm* — Robert R. Williams

(57) ABSTRACT

A static random access memory (SRAM) includes an SRAM cell to store a bit of data. A word line accesses the SRAM cell, which, responsively, during a read, drives either a bit line true (BLT) or a bit line complement (BLC) low. Both BLT and BLC are precharged to a supply voltage, then, subsequently are discharged to a reference voltage, lower than the supply voltage, prior to the word line being activated. Because the bit lines are at a voltage lower than the supply voltage when the SRAM cell is activated, the SRAM cell stability is improved.

7 Claims, 4 Drawing Sheets

US 8,331,180 B2

ACTIVE BIT LINE DROOP FOR READ ASSIST

FIELD OF THE INVENTION

This invention relates generally to static random access memory (SRAM). In particular, the invention relates to improving read stability in SRAMs.

SUMMARY OF EMBODIMENTS OF THE INVENTION

Static Random Access Memory (SRAM) cell stability has become a large issue with newer technologies due to doping variations and Field Effect Transistor (FET) threshold voltage (VT) mismatches of increasingly smaller FET devices. One solution to combat this problem is the inclusion of a separate voltage supply for just the SRAM cell. Often referred to as VCS, this supply is typically held around 100 mV (millivolt) to 150 mV higher than a chip supply (VDD). By increasing the voltage seen at the SRAM cell it is possible to meet read performance specifications without reducing the stability of the SRAM cell.

Unfortunately, the inclusion of VCS comes with several drawbacks. Adding a second supply voltage to a semiconductor chip increases the overall cost of the semiconductor chip and introduces a new power grid that must be connected at higher metal levels on the semiconductor chip. In addition, costs of a separate power regulator off of the semiconductor chip, and power interconnects in a second level package (e.g., printed wiring cards and chip carrier) are also drawbacks.

In embodiments of the invention, instead of requiring a VCS supply voltage higher than the chip supply VDD voltage, bit lines in an SRAM are reduced from VDD prior to activating a word line during a read. Less current is required of an SRAM cell to drive a bit line low given the bit line is already lower than VDD. This improves stability of the SRAM cell.

In an embodiment of the invention, a semiconductor chip comprises an SRAM. The SRAM further comprises an SRAM cell configured to store a bit of data in the SRAM. A bit line true (BLT) and a bit line complement (BLC) are driven by the SRAM cell responsive to the cell being accessed by a word line. Both bit lines are precharged to VDD and then partially discharged to a reference voltage prior to the word line being activated.

In an embodiment of the invention, a design structure is created on a tangible computer readable medium that, when used in a suitable manufacturing facility, produces (creating and testing) a semiconductor chip comprising an SRAM. The SRAM further comprises an SRAM cell configured to store a bit of data in the SRAM. A bit line true (BLT) and a bit line complement (BLC) are driven by the SRAM cell responsive to the cell being accessed by a word line. Both bit lines are precharged to VDD and then partially discharged to a reference voltage prior to the word line being activated.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for "drooping" (slightly discharging) bit lines to a reference voltage prior to a word line activation during a read operation in a static random access memory (SRAM). Reducing bit line voltage provides improved SRAM cell stability during the read operation.

Figure 1:
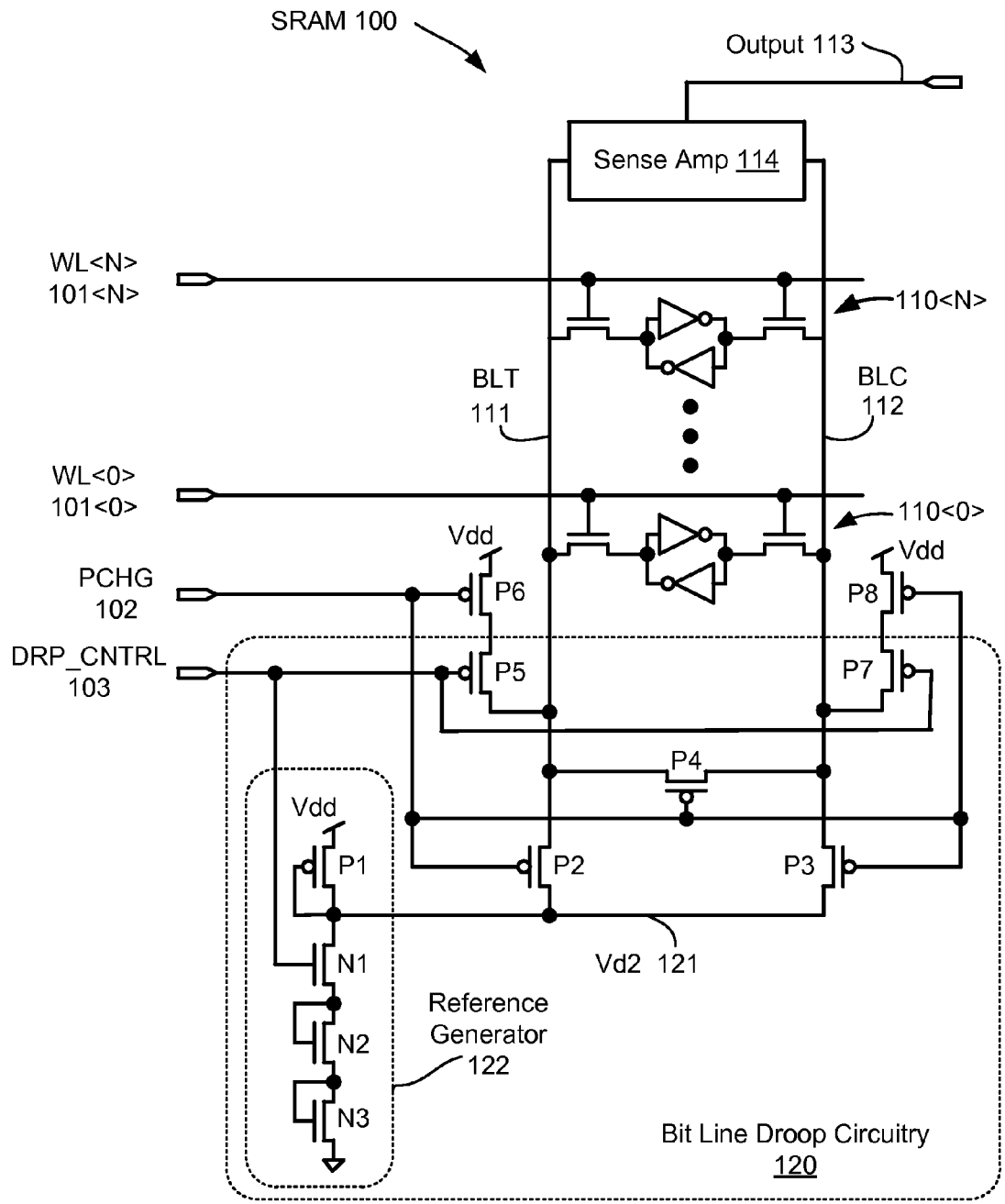
FIG. 1 shows a schematic of relevant portions of a static random access memory (SRAM), including array cells, word lines, and bit lines. A bit line droop circuitry is shown.
Figure 4:
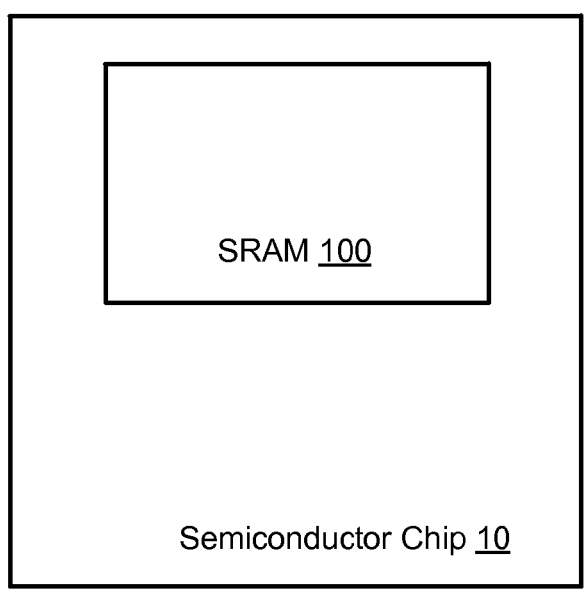
FIG. 4 shows a semiconductor chip comprising the SRAM.

Turning now to FIG. 1, an SRAM 100 is shown to comprise a plurality of SRAM cells 110, shown as 110<0> through 110<N>. SRAM 100 may be a single chip SRAM, or may be an SRAM contained on a semiconductor chip having other functional units. FIG. 4 depicts SRAM 100 embedded on a semiconductor chip 10.

As is well known, SRAM cells are typically arrayed horizontally to provide a word having more than a single bit. For simplicity herein, only a single column of SRAM cells 110 is shown. Word lines WL 101, shown as WL<0> 101<0> through WL<N> 101<N> provide a way to access SRAM cells 110 for a particular word. For example, WL<0> 110<0> will turn on NFET pass gates shown in SRAM cell 110<0> which will couple the cross coupled inverters shown in SRAM cell 110<0> to bit lines BLT (bit line true) 111 and BLC (bit line complement) 112. Bit lines are precharged "high" (Vdd) early in a read operation, using PCHG 102.

In an embodiment of the invention, a bit line droop circuitry 120 is used to reduce voltage on both BLT 111 and BLC 112 to a reference voltage prior to activating a word line during a read operation, and after precharge of the BLT and BLC has ended. Reducing bit line voltages improves stability of SRAM cell 110 by presenting a lower voltage for the accessed SRAM cell 110 to drive low. If a "0" is stored in an accessed SRAM cell 110, BLT 111 will be pulled down from the reduced voltage on BLT 111; BLC 112 will remain "high" (at the reduced voltage to which BLC 112 was discharged). A sense amplifier 114 will determine that BLT 111 is lower than BLC 112 (for the exemplary data value) and will drive an output 113 from SRAM 100 accordingly. The inverter at "0" in the SRAM cell 110 must pull the associated bit line low, and doing so raises an output voltage of that inverter, possibly causing instability of the accessed SRAM cell 110 during a read. If the inverter driving "0" in the SRAM cell 110 doesn't have to discharge the bit line as far, less current is required of the inverter and therefore the output voltage of the inverter does not rise as much. In addition, read performance may be improved because the bit line that is to be discharged upon word line activation does not need to drop as far to be interpreted as a "0".

Bit line droop circuitry 120 comprises a reference generator 122 that, when activated by "droop control" DRP_CNTRL 103, produces a reference voltage on node Vd2 121 suitable to cause a "droop" (voltage reduction) on BLT 111 and BLC 112. Reference generator 122 is designed to produce the reference voltage on node Vd2 121 that is approximately 85% of Vdd using suitable sizes of (P-channel Field Effect Transistor (PFET) P1, N-Channel Field Effect Transistor (NFET) N2, and NFET N3, and NFET N1 to a lesser degree since N1, when "on" will have a gate voltage of Vdd. For simplicity of explanation, N1 will be considered "a switch", although those skilled in the art will recognize that an "on" FET still has some impedance. In current technologies, Vd2 121 will droop to approximately 85% of Vdd (100 mV to 150 mV "droop" in current technologies) when reference generator 122 is enabled. Vd2 121, when reference generator 122 is enabled, may be 70% to 90% of Vdd in some designs, but must not be so low as to cause a Vdd-Vd2 121 voltage to exceed a threshold voltage of a pass gate in SRAM cell 110. Herein, "P" indicates a PFET and "N" indicates an NFET.

Reference generator 122 is enabled when DRP_CNTRL 103 is "active" (i.e., "1") and turns N1 on. DRP_CNTRL 103 going active also ends the precharge of BLT 111 and BLC 112, as P5 and P7 are turned off.

Bit lines BLT 111 and BLC 112 are precharged to Vdd when PCHG 102 and DRP_CNTRL 103 are "0", causing current to flow from Vdd through P5 and P6 to BLT 111, and from Vdd through P7 and P8 to BLC 112. At this time, reference generator 122 is disabled (N1 is "off" when DRP_CNTRL 103 is "0"). When PCHG is "0", P4 is turned on, ensuring that BLT 111 and BLC 112 are at the same voltage.

After BLT 111 and BLC 112 are precharged to Vdd, PCHG 102 is kept at "0" and DRP_CNTL 103 is switched to "1" (i.e., Vdd), turning on N1 and thereby activating reference generator 122 and simultaneously ending precharge of BLT 111 and BLC 112 (because P5 and P7 are turned off). P2 and P3 are "on" because PCHG is still at "0". When PCHG is "0", BLT 111 and BLC 112 are coupled to reference generator 122. BLT 111 and BLC 112 are discharged through P2 and P3 to a voltage determined by reference generator 122 and at a rate determined by conductance of P2, P3, N1, N2, and N3. P4 again assures that BLT 111 and BLC 112 remain at a same voltage when PCHG 102 is "0".

Figure 2:
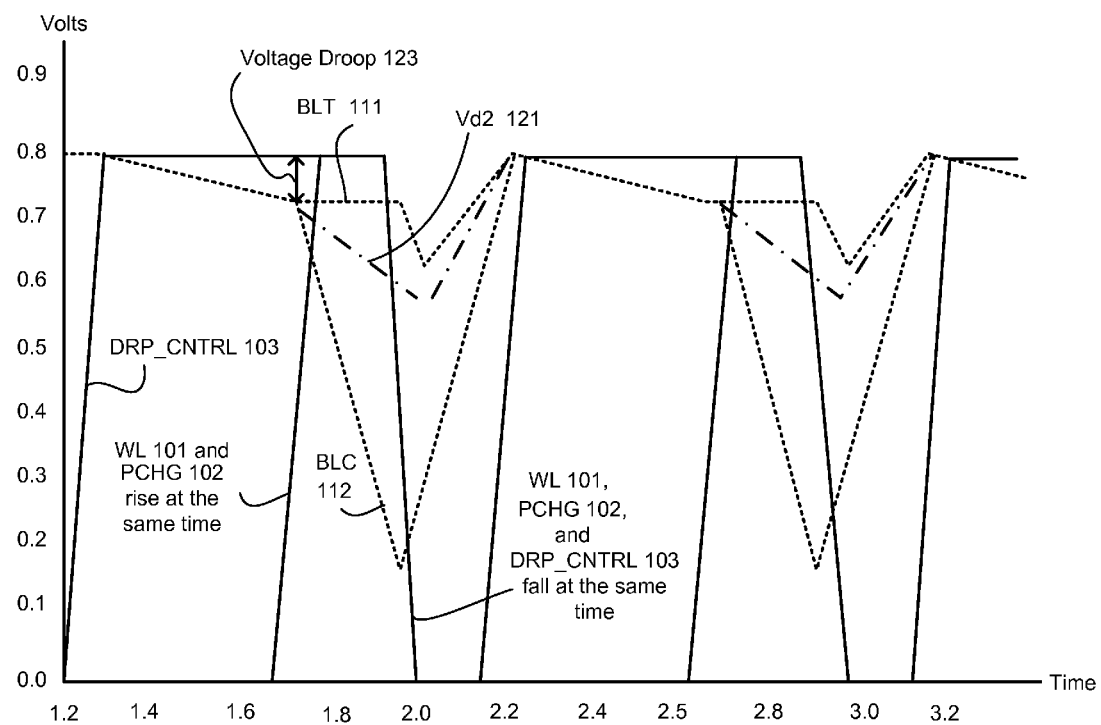
FIG. 2 shows exemplary waveforms at selected nodes in the circuitry of FIG. 1.

FIG. 2 shows waveforms of two complete read cycles of SRAM 100, beginning at a time 1.2 ns (nanoseconds). At time 1.2, both BLT 111 and BLC 112 (both indicated with dotted lines) are precharged to Vdd (0.8 volts), PCHG is at 0.0 volts. At time 1.2 ns, DRP_CNTRL 103 rises, turning on reference generator 122 which then produces the reference voltage on node Vd2 121. BLT 111 and BLC 112 ramp downwards, as explained above, dropping to the reference voltage established on node Vd2 121. Voltage droop 123 is a voltage difference between Vdd and the reference voltage. In current technology, voltage droop 123 is approximately 100 to 150 mV. In a future technology where Vdd is less than 0.8 volts, reference generator 122 may be designed to provide a voltage droop 123 of under 100 mV. As noted above, voltage droop 123 must not exceed the threshold voltage of the pass gate FETs in SRAM cell 110.

At a time of approximately 1.65 ns in FIG. 2, WL 101 and PCHG 102 are driven high. BLC 112 is driven "lower" from its partially discharged voltage of (Vdd-voltage droop 123) by an inverter in SRAM cell 110 coupled through an NFET pass gate in SRAM cell 110 to BLC 112 from an SRAM cell addressed by the activated WL 101. BLT 111 remains at the reference voltage, Vdd-voltage droop 123. The depicted pass gate coupling BLT 111 to the output of the corresponding inverter in the selected SRAM cell 110 remains "off", as Vdd-voltage droop 123 is, as described above, 100 my to 150 my, which is less than a threshold voltage of the pass gate. In the current example where BLC 112 is driven lower by the SRAM cell 110, the inverter in SRAM cell 110 that is coupled to BLT through the pass gate FET connected to BLT 111 has an inverter output of Vdd. The Vdd-voltage droop 123 must not exceed a threshold voltage of the pass gates in the SRAM cell 110 or unwanted current would flow from the inverter in SRAM cell 110 that is at "1" through the associated pass gate to the associated bit line. This unwanted current would flow through P2, P3, P4 and into reference generator 122 during at least some of the time between DRP_CNTRL 103 rising and PCHG 102 rising.

Vd2 121 is disconnected from BLC 111 and BLT 112 when PCHG 102 is high; reference generator 122 will pull Vd2 slightly lower, since there is no longer current flowing through series P6 and P5 or series P8 and P7 through P2 and P3. A conventional sense amplifier compares BLT 111 and BLC 112 to determine whether a "1" or a "0" is stored at the addressed SRAM cell 110. Determination, by sense amplifier 114, is done prior to WL 101, PCHG 102 and DRP_CNTRL 103 falling at time 2.0 ns as shown in FIG. 2. When WL 101 falls, no SRAM cell 101 is selected. DRP_CNTRL 103 falling causes reference generator 122 to turn off, PCHG and DRP_CNTRL 103 falling cause P4, P5, P6, P7 and P8 to conduct, charging bit lines BLT 111 and BLC 112, and Vd2 121 to VDD to prepare SRAM 100 for a second read, which proceeds as a repetition of the waveforms described above. Note that node Vd2 121 and BLT 111 (using the SRAM cell data value assumed) may be momentarily pulled down slightly, until DRP_CNTRL 103 turns off N1, and PCHG 102 drives BLT 111 and BLC 112 upwards again.

It will be understood by those skilled in the art that a typical SRAM may comprise additional circuitry, such as bit line drivers to drive bit lines during writes, timing circuits, and the like. This additional circuitry is not needed for explanation of how bit lines are partially discharged to a reference voltage during a read, and, for brevity, is not shown or described.

Figure 3:
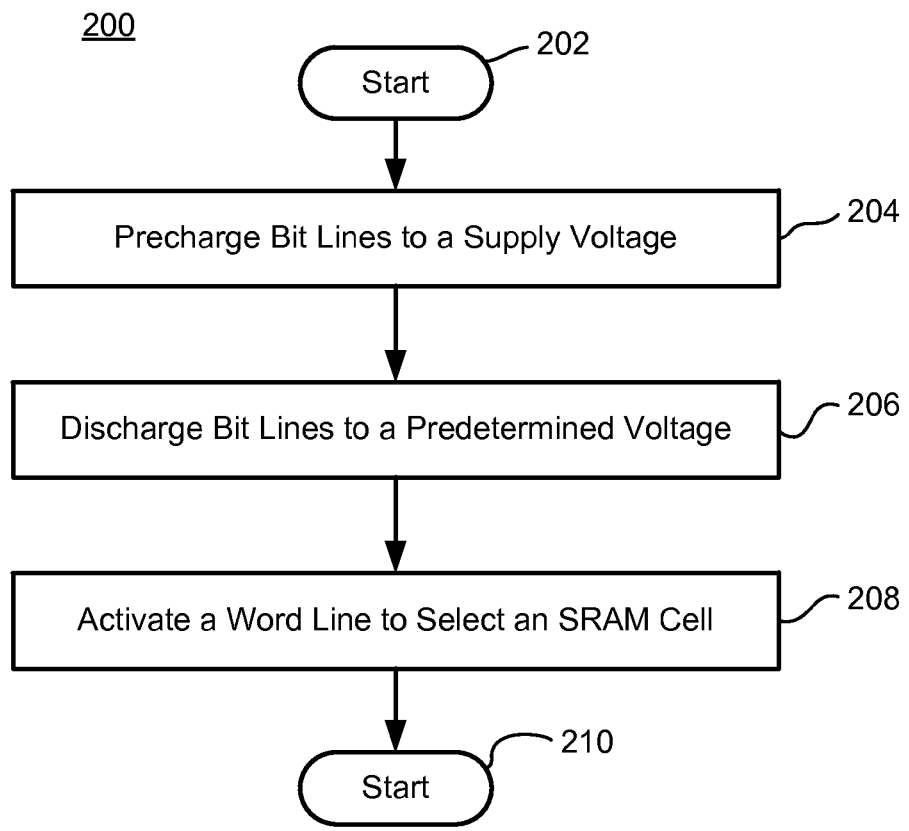
FIG. 3 shows a flow chart of a method embodiment of the invention.

Embodiments of the invention may be expressed as methods. FIG. 3 depicts a method 200 embodiment of the invention. Method 200 begins at block 202.

In block 204, during a read, bit lines in an SRAM array are precharged to a supply voltage, such as Vdd. In block 206, both true and complement bit lines are subsequently partially discharged by a predetermined amount (such as voltage droop 122 in FIG. 2) to a reference voltage. The predetermined amount, in current technologies is approximately 100 mV to 150 mV, but may be a smaller amount in future technologies where the supply voltage is lower. In block 208, a word line is activated to read a data stored in an SRAM cell. The SRAM cell will further discharge, from the partial discharged voltage of block 206, either a true or a complement bit line; a sense amplifier will determine whether the value stored in the SRAM cell is a logical "1" or a logical "0" depending on relative voltages of the true and the complement bit line. Block 210 ends method 200.

Figure 5:
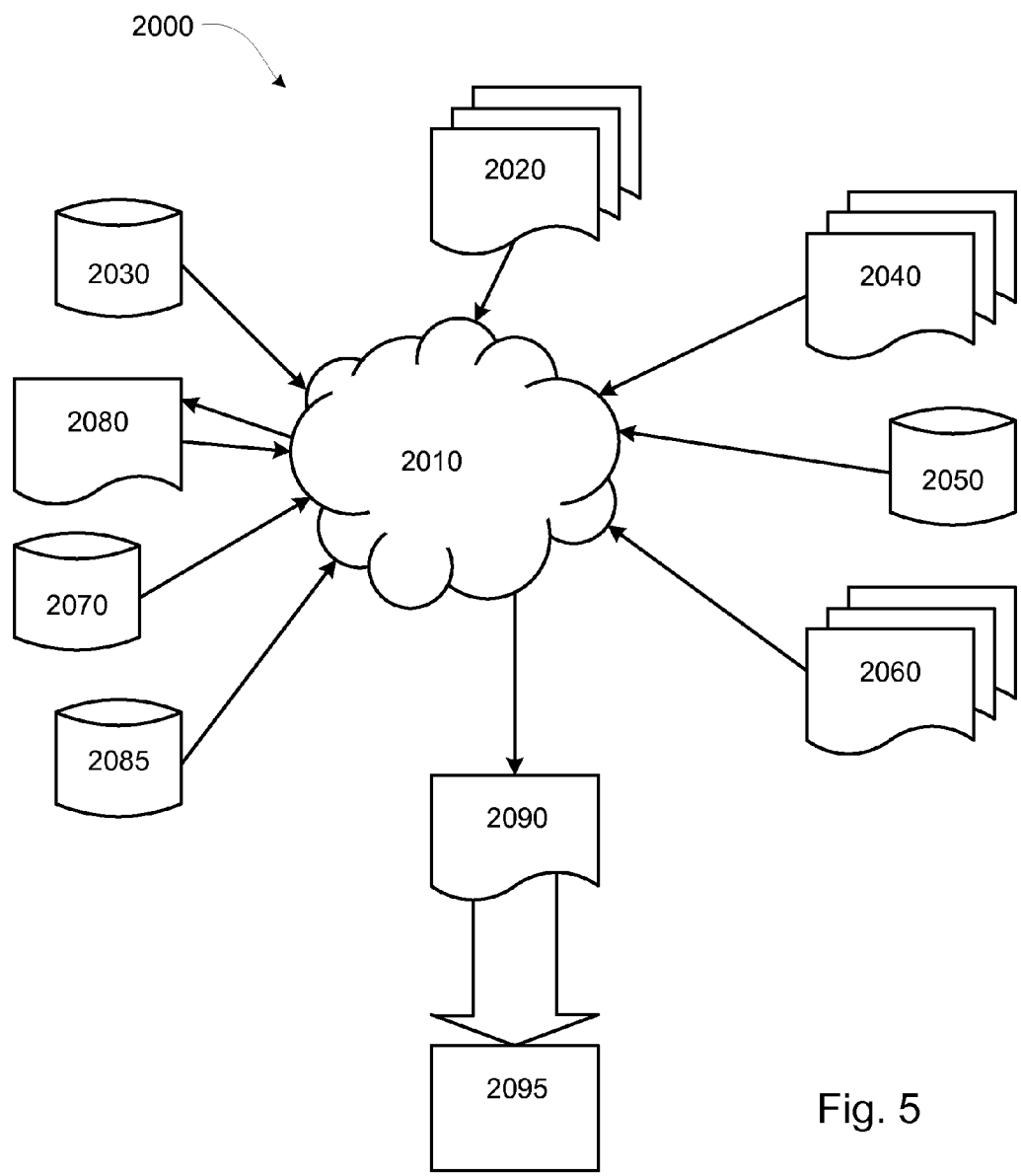
FIG. 5 shows a design process including a design structure, suitable for manufacturing and testing the SRAM.

FIG. 5 shows a block diagram of an example design flow 2000 that may be used for designing, creating, and testing the SRAM 100 of FIG. 1. Design flow 2000 may vary depending on the type of integrated circuit being designed. For example, a design flow 2000 for a static random access memory may differ from a design flow 2000 for a dynamic random access memory. In addition, design flow 2000 may differ for different semiconductor processes. Design structure 2020 is preferably an input to a design process 2010 and may come from an IP provider, a core developer, or other design company or may be generated by the operator of the design flow, or from other sources. Design structure 2020 comprises circuits described above, for examples in FIGS. 1-16 in the form of schematics or HDL (High Level Design Language), a hardware-description language (e.g., Verilog, VHDL, C, etc.). Design structure 2020 may be contained on one or more tangible computer readable medium. For example, design structure 2020 may be a text file or a graphical representation of circuits described above. Examples of tangible computer readable medium include hard disks, floppy disks, magnetic tapes, CD ROMs, DVD, flash memory devices, and the like. Design process 2010 preferably synthesizes (or translates) the circuits described above into a netlist 2080, where netlist 2080 is, for example, a list of wires, transistors, logic gates, control circuits, I/O, models, etc. that describes the connections to other elements and circuits in an integrated circuit design and recorded on the at least one computer readable medium. This may be an iterative process in which netlist 2080 is resynthesized one or more times depending on design specifications and parameters for the circuit.

Design process 2010 may include using a variety of inputs; for example, inputs from library elements 2030 which may house a set of commonly used elements, circuits, and devices, including models, layouts, and symbolic representations, for a given manufacturing technology (e.g., different technology nodes, 32 nm, 45 nm, 90 nm, etc.), design specifications 2040, characterization data 2050, verification data 2060, design rules 2070, and test data files 2085 (which may include test patterns and other testing information). Design process 2010 may further include, for example, standard circuit design processes such as timing analysis, verification, design rule checking, place and route operations, etc. One of ordinary skill in the art of integrated circuit design can appreciate the extent of possible electronic design automation tools and applications used in design process 2010 without deviating from the scope and spirit of the invention. The design structure of the invention is not limited to any specific design flow.

Design process 2010 preferably translates an embodiment of the invention as shown in the various logic diagrams and the underlying circuitry, along with any additional integrated circuit design or data (if applicable), into a second design structure 2090. Design structure 2090 resides on a tangible computer readable storage medium in a data format used for the exchange of layout data of integrated circuits (e.g. information stored in a GDSII (GDS2), GL1, OASIS, or any other suitable format for storing such design structures). Design structure 2090 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in the logic diagrams in the figures. Design structure 2090 may then proceed to a stage 2095 where, for example, design structure 2090 proceeds to tape-out, is released to manufacturing, is released to a mask house, is sent to another design house, is sent back to the customer, etc.

Furthermore, it should be understood that at least some aspects of the present invention, including those described with reference to FIGS. 1, 3 and 4, may alternatively be implemented in a program product. Programs defining functions of the present invention can be delivered to a data storage system or a computer system via a variety of tangible signal-bearing media (e.g., a floppy disk, hard disk drive, read/write CD ROM, DVD, optical media), and communication media, such as computer and telephone networks including Ethernet. It should be understood, therefore, in such signal-bearing tangible media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

What is claimed is:

1. A semiconductor chip comprising:
    a static random access memory (SRAM), further comprising;
        an SRAM cell configured to store a bit of data in the SRAM;
        a word line configured to access the SRAM cell;
        a bit line true (BLT) and a bit line complement (BLC) coupled to the SRAM cell for reading data from the SRAM cell;
        a precharge signal configured to precharge both the BLT and the BLC to a supply voltage; and
        a bit line droop circuitry configured to change both the BLT and the BLC from the supply voltage to a reference voltage before the word line accesses the SRAM cell.

2. The semiconductor chip of claim 1, wherein the reference voltage is between 70 percent and 90 percent of the supply voltage.

3. The semiconductor chip of claim 2, wherein a voltage difference between the supply voltage and the reference voltage is less than a threshold voltage of a pass gate field effect transistor in the SRAM cell.

4. The semiconductor chip of claim 1, the SRAM further comprising:
    a first P-channel Field Effect Transistor (PFET), and a second PFET each having a gate coupled to a precharge signal, and each having a source coupled to the supply voltage;
    the bit line droop circuitry further comprising:
        a reference generator configured to output the reference voltage when the reference generator is enabled;
        a third and a fourth PFET, each having a gate coupled to the precharge signal and each having a drain coupled to the reference voltage, a source of the third PFET coupled to the BLT and a source of the fourth PFET coupled to the BLC;
        a fifth PFET having a gate coupled to the precharge signal, a source coupled to the BLT and a drain coupled to the BLC;
        a sixth PFET having a gate coupled to a droop control signal, a drain coupled to the BLT, and a source coupled to a drain of the first PFET; and
        a seventh PFET having a gate coupled to the droop control signal, a drain coupled to the BLC, and a source coupled to a drain of the second PFET.

5. A method for reading data from a static random access memory (SRAM) cell comprising:
    precharging to a supply voltage a bit line true (BLT) and a bit line complement (BLC) coupled to the SRAM cell;
    activating a reference generator to generate a reference voltage;
    discharging the BLT and the BLC to the reference voltage;
    activating a word line to cause the SRAM cell to drive the data stored in the SRAM cell onto the BLT and the BLC; and
    causing the reference voltage to be between 70 percent and 90 percent of the supply voltage, and a difference between the reference voltage and the supply voltage being less than a threshold voltage of a pass gate Field Effect Transistor (FET) that, when turned on by the word line allows the SRAM cell to drive the data stored in the SRAM cell onto the BLT and the BLC.

6. The method of claim 5 further comprising isolating the reference voltage from the BLT and the BLC when the word line is activated.

7. A design structure, for a semiconductor chip, the semiconductor chip comprising:
   a static random access memory (SRAM), further comprising;
   an SRAM cell configured to store a bit of data in the SRAM;
   a bit line configured to access the SRAM cell;
   a bit line true (BLT) and a bit line complement (BLC) for reading data from the SRAM cell;
   a precharge signal configured to precharge both the BLT and the BLC to a supply voltage; and
   a bit line droop circuitry configured to discharge both the BLT and the BLC to a reference voltage before the word line accesses the SRAM cell.

* * * * *